(12) United States Patent
Singh et al.

(10) Patent No.: US 8,792,293 B2
(45) Date of Patent: Jul. 29, 2014

(54) SINGLE-ENDED SENSE AMPLIFIER FOR SOLID-STATE MEMORIES

(71) Applicant: LSI Corporation, Milpitas, CA (US)

(72) Inventors: Sahilpreet Singh, Amritsar (IN); Disha Singh, Varanasi (IN)

(73) Assignee: LSI Corporation, Milpitas, CA (US)

( * ) Notice: Subject to any disclaimer, the term of this patent is extended or adjusted under 35 U.S.C. 154(b) by 120 days.

(21) Appl. No.: 13/661,250

(22) Filed: Oct. 26, 2012

(65) Prior Publication Data

US 2014/0119093 A1   May 1, 2014

(51) Int. Cl.
*G11C 7/00* (2006.01)
*G11C 11/4091* (2006.01)
*G11C 7/06* (2006.01)

(52) U.S. Cl.
CPC ............ *G11C 11/4091* (2013.01); *G11C 7/065* (2013.01); *G11C 7/06* (2013.01)
USPC ............................... 365/205; 365/63; 365/208

(58) Field of Classification Search
CPC ...... G11C 11/4095; G11C 7/065; G11C 7/06; G11C 5/147; G11C 2207/063
USPC ............ 365/205, 207, 208, 51, 63, 190, 149, 365/189.05
See application file for complete search history.

(56) References Cited

U.S. PATENT DOCUMENTS

| | | | | |
|---|---|---|---|---|
| 5,673,232 A | * | 9/1997 | Furutani | 365/226 |
| RE36,932 E | * | 10/2000 | Furutani | 365/226 |
| 7,821,859 B1 | * | 10/2010 | Raghavan | 365/208 |
| 8,576,610 B2 | * | 11/2013 | Yoshida | 365/149 |
| 2006/0050581 A1 | * | 3/2006 | Luk et al. | 365/205 |

\* cited by examiner

*Primary Examiner* — Gene Auduong

(57) ABSTRACT

Described embodiments provide a memory having at least one sense amplifier. The sense amplifier has a first capacitor, an inverting amplifier, a switch, an amplifier, and a second capacitor. The first capacitor is coupled between the input of the sense amplifier and a first node. The inverting amplifier has an input coupled to the first node and an output coupled to an internal node and the switch is coupled between the input and output of the inverting amplifier. The amplifier has an input coupled to the internal node and an output coupled to an output of the sense amplifier and the second capacitor is coupled between the internal node and a control node. When data is to be read from the memory, the second capacitor forces a small voltage reduction onto the intermediate node, helping the sense amplifier resolve the data value stored in the memory cell.

23 Claims, 4 Drawing Sheets

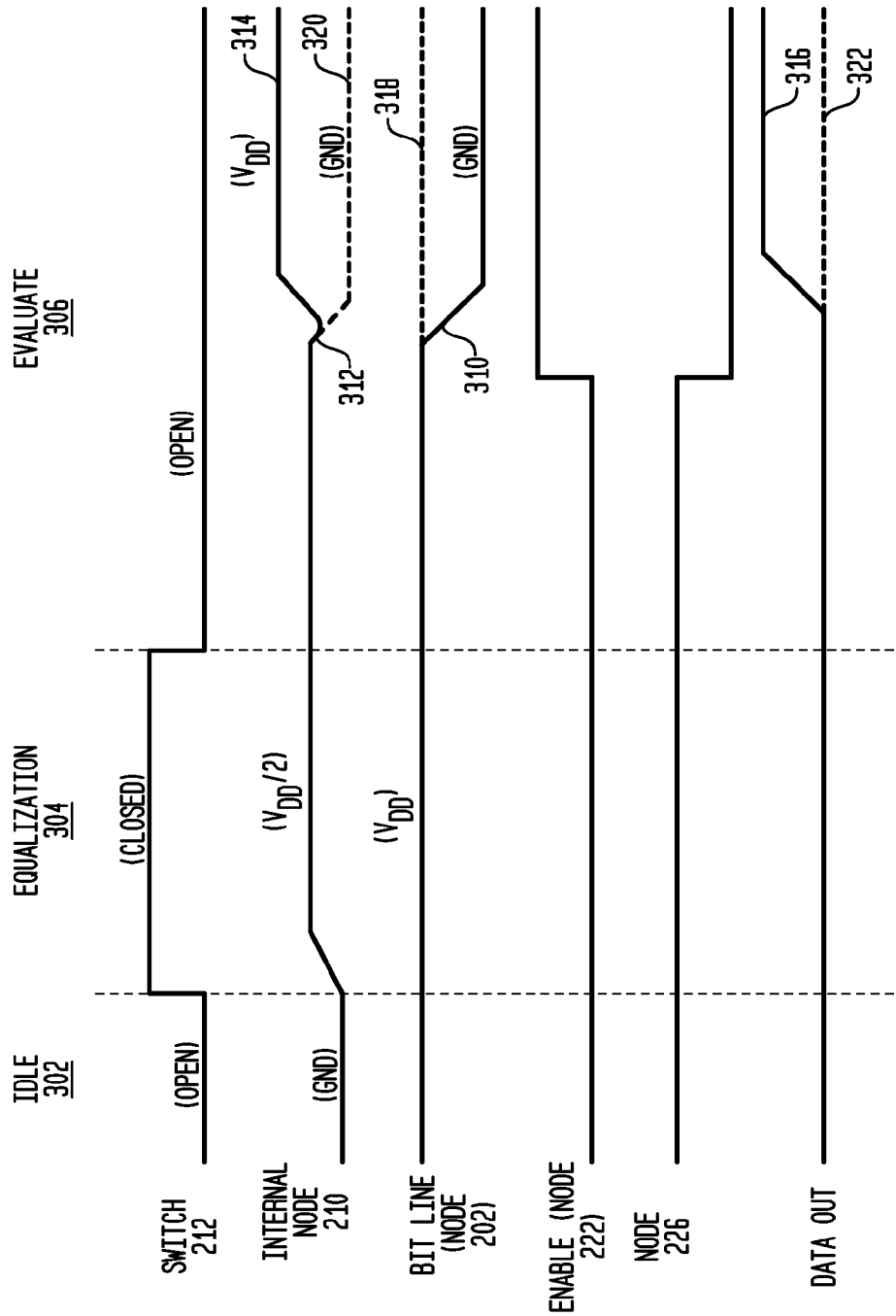

SINGLE-ENDED SENSE AMPLIFIER FOR SOLID-STATE MEMORIES

BACKGROUND OF THE INVENTION

A typical solid-state memory device has multiple memory cells coupled to bit lines that facilitate the extraction of data stored in memory cells, the extracted data to be presented at an output of the device. When data is to be read from a cell, the cell is activated and a transistor in the cell (generally referred to as an access transistor) will or will not change a pre-established voltage on the bit line depending on the data stored in the active cell. Because transistors in the memory cells are typically very small and thus are weak, and generally each bit-line is coupled to hundreds of other (inactive) cells resulting in each bit-line having significant capacitive loading, the amount of change in bit-line voltage during a defined time period is relatively small. To determine what data value the active cell is storing, each bit-line has attached thereto a sense amplifier that amplifies any change in the bit-line voltage and "slices" the amplified voltage change to produce at an output of the sense amplifier a binary one or zero. The output of the sense amplifier is then coupled to the output of the memory for use in the apparatus using the memory device, e.g., a computer.

Bit-lines are of two types: differential and single-ended. Differential bit-lines are less susceptible to induced noise than single-ended bit-lines but a memory having differential bit-lines requires twice the number of bit-line conductors compared to a memory with single-ended bit-lines and a concomitant increase in memory complexity and area. However, a memory with differential bit lines might have the fastest memory access time (used here as the time required for the memory to present data at its output measured from when an address is first applied to the memory and the memory enabled) but can only be used where a memory cell has differential outputs, e.g., static random access memory (SRAM). For those memory devices having non-differential output memory cells, single-ended bit-lines are used, such as in a read-only memory (ROM), electrically-programmable memory (e.g., EEPROM, FLASH, etc.), or a dynamic random access memory (DRAM). However, some memory designs, which would otherwise use differential bit-lines, might instead use single-ended bit-lines to save area and power when short access time is not an overriding requirement.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a memory having at least one sense amplifier. The sense amplifier has a first capacitor, an inverting amplifier, a switch, an amplifier, and a second capacitor. The first capacitor is coupled between the input of the sense amplifier and a first node. The inverting amplifier has an input coupled to the first node and an output coupled to an internal node and the switch is coupled between the input and output of the inverting amplifier. The amplifier has an input coupled to the internal node and an output coupled to an output of the sense amplifier and the second capacitor is coupled between the internal node and a control node.

BRIEF DESCRIPTION OF THE DRAWINGS

Other embodiments of the present invention will become more fully apparent from the following detailed description, the appended claims, and the accompanying drawings in which like reference numerals identify similar or identical elements.

FIG. 3 is a timing diagram of operation of the memory of FIG. 1 and the sense amplifier of FIG. 2.

DETAILED DESCRIPTION

Figure 1:
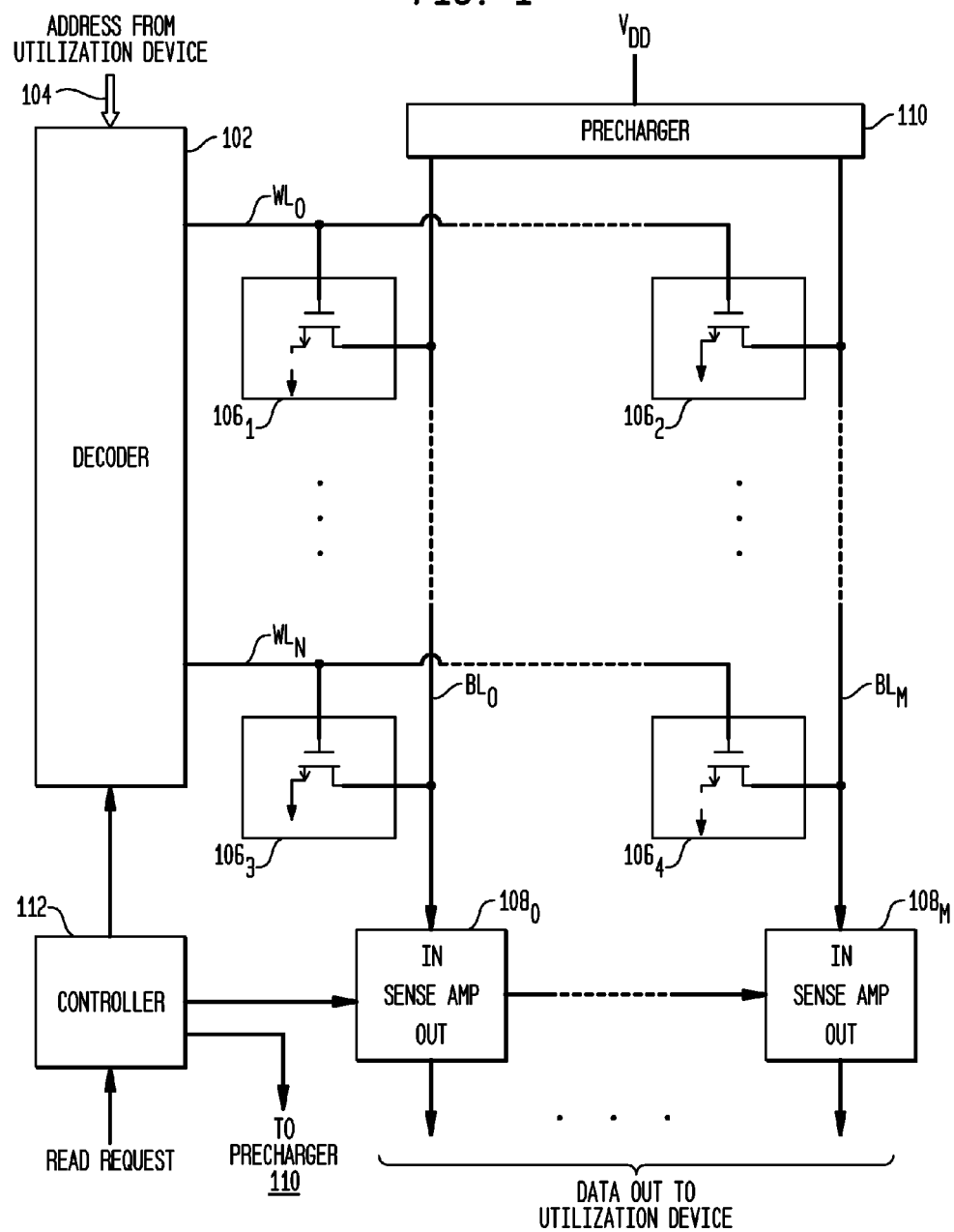
FIG. 1 is a simplified block diagram illustrating an exemplary memory according to an embodiment of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of embodiments that are methods are not necessarily required to be performed in the order described, and the order of the steps of such embodiments should be understood to be merely exemplary. Likewise, additional steps might be included in such embodiments, and certain steps might be omitted or combined, consistent with various embodiments of the present invention.

Also for purposes of this description, the terms "couple", "coupling", "coupled", "connect", "connecting", or "connected" refer to any manner known in the art or later developed in which energy is allowed to be transferred between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise. Further, elements in a figure having subscripted reference numbers, (e.g., $100_1$, $100_2$, . . . $100_K$ might be collectively referred to herein using the reference number 100.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, object code, executable code, a thread of execution, a program, and/or a computer. By way of illustration, both an application running on a controller and the controller can be a component. One or more components may reside within a process and/or thread of execution and a component may be localized on one computer and/or distributed between two or more computers.

Embodiments of the invention will be described in the context of a sense amplifier adapted for use in a solid-state memory, such as a read-only, a dynamic random access memory, or the like. It is to be appreciated, however, that embodiments of the invention are not limited to the specific apparatus and methods illustratively shown and described herein. Rather, embodiments of the invention are directed broadly to techniques for beneficially providing a single-ended sense amplifier that is capacitively coupled to a bit line and has a capacitor that perturbs or "bumps" the amplifier's output to an extent that the sense amplifier reliably stabilizes in a desired state when no bit line discharge occurs.

FIG. 1 is a generalized block diagram of an exemplary solid-state memory 100. For purposes of this description, this embodiment is as a read-only memory (ROM) programmed at manufacture using lithographic techniques (selective metallization of the memory cells 106 using one or more masks) or laser-programmed fuses (not shown). However, as illustrated in connection with FIG. 4, it is understood that in alternative embodiments the memory 100 can be but is not limited to a field-programmable ROM (using programmable fuses), dynamic random access memory (DRAM), static random access memory (SRAM), or an electrically programmable memory cell (EPROM, EEPROM, FLASH, etc.) based on the memory cell type and the presence of the necessary support circuitry (e.g., write drivers, programming voltage generators, write data lines, etc., not shown).

A conventional address decoder 102 in memory 100 receives a multi-bit address via address bus 104 from a utilization device such as a computer or the like. The address decoder 102 enables one of several word lines $WL_0$-$WL_N$ (N is an integer≥1) in response to the address. In this example, an enabled word line has a voltage substantially equal to $V_{DD}$ (the power supply voltage) whereas the remaining word lines have a voltage of substantially zero volts. These voltages are sufficient to turn on and turn off an access transistor in each of the memory cells 106, described below. It is understood that the decoder 102 may assert other voltages on the word lines.

Each of the memory cells 106 have an input coupled to a corresponding word line and an output coupled to corresponding bit lines $BL_0$-$BL_M$, where M is an integer≥0. The bit lines couple the outputs of the memory cells coupled thereto to an input IN of a corresponding sense amplifier $108_0$-$108_M$. As will be explained in more detail below in connection with FIG. 2, the sense amplifiers amplify relatively small signals on the corresponding bit lines to determine the logic value of data stored in the memory cells, e.g., a logical one (1) or zero (0). Logic-level signals (having a voltage of approximately $V_{DD}$ for a logical 1 and ground or approximately zero volts for a logical 0 in this embodiment but in an alternative embodiment, the voltages are reversed) on the output OUT of each sense amplifier is coupled to the utilization device to form an output of one or more bits. Alternatively, one or more multiplexers (not shown) responsive to additional address bits from the utilization device might be used to select a subset of the data bits from the sense amplifiers for coupling to the utilization device.

In this embodiment, each of the memory cells 106 comprises an access transistor (not numbered) having a gate terminal coupled to the corresponding word line and a drain terminal coupled to the corresponding bit line. The data value stored in a given memory cell is established by whether or not the source terminal of the access transistor is grounded or "floats". For example, the source terminal of the access transistor in memory cell $106_2$ is grounded and thus stores a logical 0, whereas the access transistor in cell $106_1$ is not grounded and that cell stores a logical 1 although in an alternative embodiment the logic values are reversed. In an alternative embodiment, in each memory cell the source terminal is coupled to ground and the drain terminals are either coupled or not coupled to the corresponding bit line depending on the data value to be stored in the memory cell.

Exemplary operation of the memory 100, under the control of controller 112, is as follows and will be described in more detail in connection with FIG. 3. Prior to reading data out of the memory 100, the bit lines $BL_0$-$BL_M$ are precharged by a conventional precharge circuit 110 by applying, in this example, a voltage of approximately $V_{DD}$ to the bit lines by coupling the bit lines to the power supply node $V_{DD}$ before the address decoder 102 is enabled. Then, when the controller 112 receives a read request, the precharge circuit 110 is disabled, the sense amplifiers equalized, and address decoder 102 is enabled to cause one of the word lines, e.g., $WL_0$ to go high. Assuming that word line $WL_0$ is the enabled word line, the voltage on bit line $BL_M$ will be at least partially discharged toward ground by the access transistor in cell $106_2$ since the source terminal of the access transistor in cell $106_2$ is grounded, whereas the bit line $BL_0$ will not be discharged by the access transistor in cell $106_1$ because the source terminal of the access transistor in cell $106_1$ is not grounded. The sense amplifiers are enabled by the controller 112 and sense amplifier $108_M$ detects the discharging of the bit line $BL_M$ and outputs a logical 0. Correspondingly, the sense amplifier $108_0$ does not detect a discharge of the bit line $BL_0$ and the sense amplifier outputs a logical 1.

Figure 2:
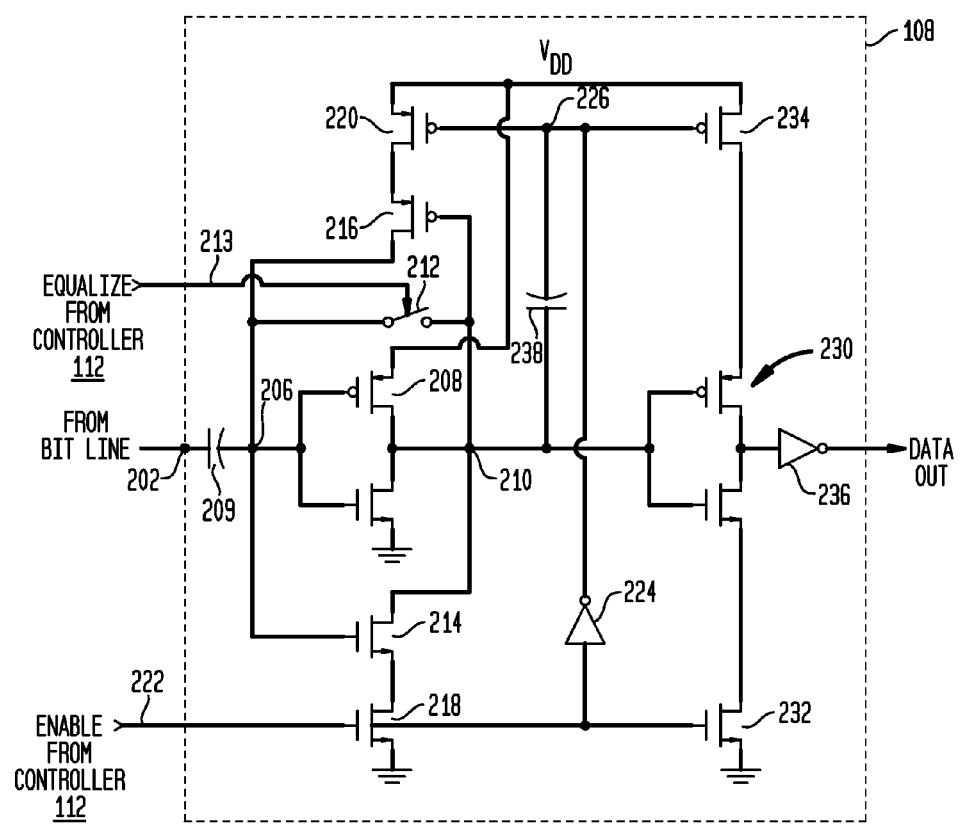
FIG. 2 is a simplified schematic diagram of a sense amplifier according to an embodiment of the invention.

FIG. 2 illustrates an embodiment of one of the sense amplifiers 108 shown in FIG. 1. An input 202 to the sense amplifier is coupled to a bit line in the memory 100 (FIG. 1). A capacitor 204 couples the input 202 to a node 206. The capacitor blocks DC but couples non-DC signals on the bit line to the node 206. An inverting amplifier 208, here a conventional inverter and sometimes referred to herein simply as an inverter, has an input coupled to the node 206 and an output coupled to intermediate node 210 and serves as the first amplifier of signals from the bit line during a read of the memory 100 (FIG. 1). A switch 212, here a conventional transmission gate controlled by a control signal 213 from controller 112 (FIG. 1), selectively couples the input to the output of the amplifier 208 and is used to force the inverting amplifier 208 to a high-sensitivity state just prior to evaluating the bit line signal when reading the memory 100. Feedback transistors 214 and 216 help to accelerate the ultimate resolution by the inverting amplifier 208 of the logic state of the data stored in the enabled memory cell coupled to the sense amplifier. The feedback transistors 214 and 216 are controlled by switch transistors 218 and 220 that are controlled in response to an enable control signal on node 222. An inverter 224 inverts the control signal on control node 222 to drive control node 226 that controls PMOS switch transistor so that both transistors 218 and 220 either are both conductive or both not conductive. The sense amplifier is enabled when the control node 222 is driven high (e.g., above $V_{DD}/2$) and control node is concurrently driven low (e.g., below $V_{DD}/2$) by inverter 224.

As described in more detail below, a capacitor disposed between control node 226 and intermediate node 210 provides a pulse of current to drive the node 210 slightly more negative when the sense amplifier is enabled.

The sense amplifier 108 can be shared with multiple bit lines by adding a multiplexer (not shown) formed from multiple transmission gates that selectively couple together node 202 and a selected one of the multiple bit lines. In one embodiment, a subset of the address bits 104 (FIG. 1) does not drive the decoder 102 but is instead used by the multiplexer to select which one of the multiple bit lines to couple to the input 202. The amplified signal on node 210 is further amplified by an inverting amplifier 230 that is enabled or disabled by switch transistors 232 and 234 in response to control signals on nodes 222 and 226. It is desirable but not essential that the sizes of the transistors in the amplifier 230 are larger than the transistors in the inverting amplifier 208.

An optional inverter 236 further amplifiers logic signals from the inverting amplifier 230. Like amplifier 230, the inverter 236 might be adapted to have enable capability responsive to the control signals on nodes 222 and 226 or another control signal to, for example, save power when the sense amplifier is not being used. Further, inverting amplifier 208 might also be adapted to have an enable capability to shut off the amplifier when power savings are desired.

The inverting amplifier 208, here an conventional complementary metal-oxide-semiconductor (CMOS) inverter powered from $V_{DD}$ and ground, has an threshold or transition voltage of approximately $V_{DD}/2$ although other voltages may be used, e.g., 0.8 volts, $\frac{2}{3}V_{DD}$, etc. As used here, the threshold voltage is the voltage applied to the input of an inverting amplifier, such as a CMOS inverter, resulting in the output voltage of the inverting amplifier being substantially the same as the input voltage and can be achieved by coupling the output of the inverting amplifier to its input. When the input of the inverter is biased at the threshold voltage, the gain of the inverter is at its highest. When the switch 212 is closed and the input of the amplifier is coupled to its output, the inverter 208 biases itself to the inverter's threshold voltage. As will be explained in more detail in connection with FIG. 3, the switch 208 remains closed until just before a memory cell coupled to the bit line begins to discharge the bit line. Once the switch 212 opens, the inverter 208 briefly remains at the transition voltage until a negative-going signal (indicating discharge of the bit line by the memory cell), coupled from the bit line to the node 206 by capacitor 204, drives the input of the inverter 208 low, resulting in the inverter 208 driving the intermediate node 210 above the transition voltage. However, should no significant decrease in the bit line voltage occur, the input and output of the inverter 208 will remain at the transition voltage. To overcome this, i.e., force the output of the inverting amplifier 208 (the intermediate node 210) to a low, stable state, the capacitor 238 "bumps" or perturbs the voltage on the intermediate node 210 to below $V_{DD}/2$, here by a few hundred millivolts with a $V_{DD}$ of 0.8 volts, when the voltage on control node 226 goes low in response to the enable signal on node 222 going high. Then feedback transistors 214 and 216 work in conjunction with the amplifier 208 to pull node 210 to ground (low) and node 206 to approximately $V_{DD}$ (high). The amount of the voltage "bump" is not so much that the voltage "bump" has a significant impact on the operation of the sense amplifier when a memory cell discharges the bit line.

Each of the capacitors 204 and 238 can be implemented using MOS transistors or metal-insulator-metal (MIM) capacitors. To implement the capacitors using MOS transistors, the gate terminal as one terminal of the capacitor and the source and drain terminals connected together as the other terminal of the capacitor. Because the capacitance of the MOS transistor can vary depending upon the gate-to-source voltage of the transistor, implementing capacitor 238 as a MOS transistor configured as a capacitor might increase the voltage "bump" delivered to the intermediate node 210 when no bit line discharge occurs when compared to the voltage bump delivered when the bit line is discharged.

The threshold voltage of the feedback transistors 214 and 216 is somewhat less than the threshold voltage of the inverting amplifier, e.g., $V_{DD}/2$, so that they do not turn on until the voltage on node 210 discharges to less than $V_{DD}/2$ and the voltage on node 206 rises above $V_{DD}/2$. Moreover, the pair of transistors 216 and 220 can be used without the other pair of transistors 214 and 218.

The capacitor 204 allows for a different DC voltage on node 206 from that on the bit lines. When the bit lines are precharged by precharge circuit 110 (FIG. 1), the voltage on the bit lines are approximately $V_{DD}$ whereas the voltage on node 206 is approximately the transition voltage of the inverter 208 when switch 212 is closed prior to the evaluation phase of the read cycle. Interposing the capacitor 204 between the bit line and the node 206 allows for the bit line to be precharged to a voltage less than $V_{DD}$ since it is the change in the voltage on the bit line, not the absolute voltage of the bit line, that the sense amplifier 108 detects.

FIG. 3 illustrates an exemplary operation of the sense amplifier in the memory 100.

During idle state 302, the bit lines BL (FIG. 1) are precharged to $V_{DD}$ by precharge circuit 110, the address decoder 102 is inactive, and the sense amplifiers are not enabled. During this time, the node 206 (FIG. 2 and not shown in FIG. 3) is either near ground (low) or $V_{DD}$ (high) and node 210 has the opposite state. This assures that the inverting amplifier 208 does not consume significant power. In this example, the node 206 is high and node 210 is low during the idle state. The output of the sense amplifier (DATA OUT) is low.

Once an address is applied to the address decoder 102 and a read request signal is asserted to controller 112, the memory enters an equalizing state 304 during which the switch 212 is closed in response to the equalize signal on node 213 being asserted by controller 112 so that inverting amplifier 208 equalizes, in this case nodes 206 and 210 will both attain a voltage of approximately $V_{DD}/2$.

Next, the memory enters the evaluation state 306 during which the controller 112 opens switch 212 and enables the address decoder 102 that in turn enables one of the word lines (WL$_0$-WL$_N$) by being pulled high, here to approximately $V_{DD}$ (not shown in FIG. 3) to enable the memory cells 106 coupled to the enabled word line. Then the enabled memory cells with either discharge their respective bit lines or the bit line voltage does not change appreciably, as explained above. In FIG. 3, the voltage on one of the bit lines is illustrated as the voltage on node 202.

After a sufficient amount of time for the enabled memory cells to begin to discharge the bit lines, the sense amplifier enable signal on control node 226 is asserted (driven high) and, after a slight delay caused by inverter 224, the voltage on node 226 goes low. This enables the feedback transistors 214 and 216 and injects a small pulse of current into the intermediate node 210 represented by the dip or bump 312 in the voltage on node 210.

Assuming that an enabled memory cell discharges its bit line as shown by trace 310, then the discharge signal is coupled to node 206 through the capacitor 204 and reduces the voltage thereon from $V_{DD}/2$ (not shown), which in turn causes the inverting amplifier 208 to increase the voltage on the intermediate node 210 above $V_{DD}/2$, eventually reaching $V_{DD}$ as shown by trace 314 and the output of the sense amplifier DATA OUT goes high (shown as trace 316). In this case, the feedback transistors 214 and 216 remain non-conductive. Because the signal from the bit line driving the inverting amplifier 208, the bump 312 has no significant effect on the operation of the sense amplifier 108.

If, however, the enabled memory cell does not discharge its bit line, represented by dashed trace 318, the voltage on nodes 206 and 210 will remain at approximately $V_{DD}/2$. So that the sense amplifier produces the correct output signal in this scenario, the voltage bump 312 assures that the feedback transistors 214 and 216 turn on to rapidly bring the voltage on the intermediate node 210 to approximately ground potential (shown as dashed trace 320) and the node 206 to approximately $V_{DD}$, respectively. In this case, the output of the sense amplifier remains low shown by dashed trace 322.

Figure 4A:
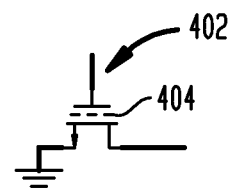
FIGS. 4A-4C are simplified schematic diagrams of alternative memory cells.
Figure 4B:
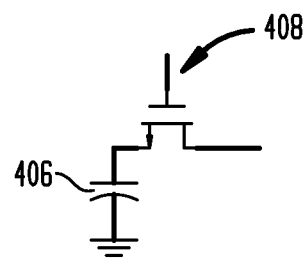
Figure 4C:
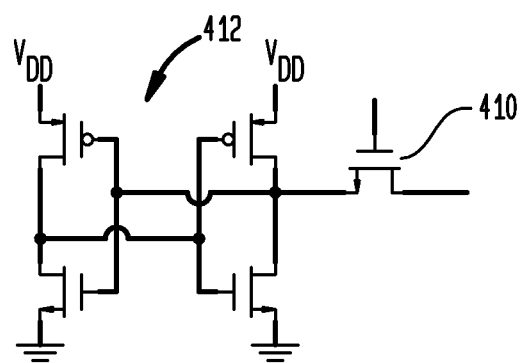

FIGS. 4A-4C illustrate alternative memory cell embodiments other than a ROM cells 106 shown in FIG. 1. In FIG. 4A, an embodiment of the invention is illustrated in which a non-volatile memory cell 104 has a conventional floating gate access transistor 402, acting as an access transistor, where the amount of charge on the floating gate 404 represents the logic value stored in the cell. In FIG. 4B an embodiment of the invention is illustrated in which a conventional dynamic memory (volatile) cell that utilizes an access transistor 408 and a storage capacitor 406 that holds a charge representing the logic value stored in the cell. In FIG. 4C, an embodiment of the invention is illustrated in which a conventional static memory (volatile) cell having an access transistor 410 and a cross-coupled inverter latch 412 that stores the logic value of the cell. It is understood that other volatile and nonvolatile memory cells may be used, including a combination of such cells.

While embodiments have been described with respect to circuit functions, the embodiments of the present invention are not so limited. Possible implementations, either as a stand-alone memory or as memory embedded with other circuit functions, may be embodied in a single integrated circuit, a multi-chip module, a single card, system-on-a-chip, or a multi-card circuit pack. As would be apparent to one skilled in the art, the various embodiments might also be implemented as part of a larger system. Such embodiments might be employed in conjunction with, for example, a digital signal processor, microcontroller, field-programmable gate array, application-specific integrated circuit, or general-purpose computer.

It is understood that embodiments of the invention are not limited to the described embodiments, and that various other embodiments within the scope of the following claims will be apparent to those skilled in the art.

We claim:

1. In a memory having at least one sense amplifier, the at least one sense amplifier comprising:
   a first capacitor coupled between the input of the sense amplifier and a first node;
   an inverting amplifier having an input coupled to the first node and an output coupled to an internal node;
   a switch coupled between the input and output of the inverting amplifier;
   an amplifier having an input coupled to the internal node and an output coupled to an output of the sense amplifier; and
   a second capacitor coupled between the internal node and a control node.

2. The memory of claim 1 further comprising a first transistor of a first conductivity type having a gate terminal coupled to the intermediate node and a drain terminal coupled to the first node.

3. The memory of claim 2 further comprising a second transistor of a second conductivity type different from the first conductivity type and having a gate terminal coupled to the first node and a drain terminal coupled to the intermediate node.

4. The memory of claim 3 further comprising:
   a third transistor of the first conductivity type having a gate terminal coupled to the control node, a drain terminal, and a source coupled to a supply voltage node; and
   a fourth transistor of the second conductivity type having a gate terminal coupled to another control node, a drain terminal, and a source coupled to a ground node;
   wherein the first transistor has a source node coupled to the drain terminal of the third transistor, and the second transistor has a source node coupled to the drain terminal of the fourth transistor.

5. The memory of claim 4 further comprising an inverter having an input coupled to the second control node and an output coupled to the first control node.

6. The memory of claim 1 wherein the second capacitor is an MOS transistor having a gate as one terminal of the second capacitor and source and drain terminals coupled together to form another terminal of the second capacitor.

7. The memory of claim 1 wherein the inverting amplifier is an inverter.

8. The memory of claim 1 wherein amplifier is an inverter having an enable input coupled to the control node.

9. The memory of claim 1 further comprising an inverter coupled between the output of the amplifier and the output of the sense amplifier.

10. The memory of claim 1 wherein the switch is a transmission gate.

11. An integrated circuit having therein a memory as recited in claim 1.

12. A memory having:
    an address decoder coupled to a plurality of word lines;
    at least one bit line;
    a plurality of memory cells coupled to the word lines and the at least one bit line; and
    a sense amplifier coupled to the at least one bit line, wherein the sense amplifier comprises:
    a first capacitor coupled between the at least one bit line and a first node;
    an inverting amplifier having an input coupled to the first node and an output coupled to an internal node;
    a switch coupled between the input and output of the inverting amplifier;
    an amplifier having an input coupled to the internal node and an output coupled to an output of the sense amplifier; and
    a second capacitor coupled between the internal node and a control node.

13. The memory of claim 11 further comprising:
    a first transistor of a first conductivity type having a gate terminal coupled to the intermediate node, a source terminal, and a drain terminal coupled to the first node;
    a second transistor of a second conductivity type, different from the first conductivity type, having a gate terminal coupled to the first node, a source terminal, and a drain terminal coupled to the intermediate node;
    a third transistor of the first conductivity type having a gate terminal coupled to the control node, a drain terminal coupled to the source terminal of the first transistor, and a source coupled to a supply voltage node; and
    a fourth transistor of the second conductivity type having a gate terminal coupled to another control node, a drain terminal coupled to the source terminal of the second transistor, and a source coupled to a ground node.

14. The memory of claim 12 wherein the switch is a transmission gate.

15. The memory of claim 12 wherein at least one of the plurality of memory cells is a non-volatile memory cell having an access transistor having a gate terminal coupled to the word lines and a drain terminal coupled to the at least one bit line.

16. The memory of claim 12 wherein at one of the plurality of memory cells is a volatile memory cell having an access transistor having a gate terminal coupled to the word lines and a drain terminal coupled to the at least one bit line.

17. The memory of claim 12 wherein the inverting amplifier is an inverter.

18. The memory of claim 12 wherein the second capacitor is an MOS transistor having a gate as one terminal of the second capacitor and source and drain terminals coupled together to form another terminal of the second capacitor.

19. The memory of claim 12 further comprising:
a precharge circuit coupled to the at least one bit lines; and
a controller;
wherein the precharge circuit, the address decoder, and the sense amplifier are controlled by the controller.

20. An integrated circuit having therein a memory as recited in claim 12.

21. The integrated circuit of claim 20 wherein the integrated circuit further incorporates a processor, a microprocessor, a microcontroller, a digital signal processor, or a field-programmable gate array coupled to the memory.

22. In an integrated circuit, a read-only memory having:
an address decoder coupled to a plurality of word lines;
at least one bit line;
a plurality of memory cells, each memory cell having an access transistor having a gate terminal coupled to the word lines and a drain terminal coupled to the at least one bit line; and
a sense amplifier coupled to the at least one bit line;
wherein the sense amplifier comprises:
a first capacitor coupled between the at least one bit line and a first node;
a first inverter having an input coupled to the first node and an output coupled to an internal node;
a transmission gate coupled between the input and output of the first inverter;
a first transistor of a first conductivity type having a gate terminal coupled to the intermediate node, a source terminal, and a drain terminal coupled to the first node;
a second transistor of a second conductivity type, different from the first conductivity type, having a gate terminal coupled to the first node, a source terminal, and a drain terminal coupled to the intermediate node;
a third transistor of the first conductivity type having a gate terminal coupled to the control node, a drain terminal coupled to the source terminal of the first transistor, and a source coupled to a supply voltage node;
a fourth transistor of the second conductivity type having a gate terminal coupled to another control node, a drain terminal coupled to the source terminal of the second transistor, and a source coupled to a ground node;
a second inverter having an input coupled to the internal node and an output coupled to an output of the sense amplifier; and
a second capacitor coupled between the internal node and a control node.

23. The memory of claim 22 wherein the second capacitor is an MOS transistor having a gate as one terminal of the second capacitor and source and drain terminals coupled together to form another terminal of the second capacitor.

* * * * *